(12) United States Patent
Jose et al.

(10) Patent No.: US 12,301,347 B2
(45) Date of Patent: May 13, 2025

(54) SYSTEMS AND METHODS FOR TRANSITION ENCODING COMPATIBLE PAM4 ENCODING (71) Applicant: Samsung Display Co., Ltd., Yongin-si (KR)

(72) Inventors: Anup P. Jose, San Jose, CA (US); Amir Amirkhany, Santa Clara, CA (US); Moonsang Hwang, Yeongdeungpo-gu (KR)

(73) Assignee: Samsung Display Co., Ltd., Yongin-si (KR)

( * ) Notice: Subject to any disclaimer, the term of this patent is extended or adjusted under 35 U.S.C. 154(b) by 323 days.

(21) Appl. No.: 17/476,387

(22) Filed: Sep. 15, 2021

(65) Prior Publication Data
US 2023/0081418 A1 Mar. 16, 2023

(51) Int. Cl.
*H04L 1/00* (2006.01)
*H03K 7/02* (2006.01)
*H04L 25/493* (2006.01)
*H03M 5/20* (2006.01)
*H04N 19/93* (2014.01)

(52) U.S. Cl.
CPC ............ *H04L 1/0008* (2013.01); *H03K 7/02* (2013.01); *H04L 1/0057* (2013.01); *H04L 1/0066* (2013.01); *H04L 25/493* (2013.01); *H03M 5/20* (2013.01); *H04N 19/93* (2014.11)

(58) Field of Classification Search
CPC ... H04L 1/005; H04L 1/07; H04L 1/00; H04L 25/493; H04L 1/0008; H04L 1/0057; H04L 1/0066; H04L 25/4906; H04L 25/4917; H04B 10/541; H03K 7/02; H03M 5/20; H04N 19/93
See application file for complete search history.

(56) References Cited

U.S. PATENT DOCUMENTS

| | | | |
|---|---|---|---|
| 4,694,491 A * | 9/1987 | Horne | H04N 21/26613 380/278 |
| 5,909,434 A | 6/1999 | Odenwalder et al. | |
| 6,374,386 B1 | 4/2002 | Kim et al. | |
| 6,437,714 B1 * | 8/2002 | Kim | H04L 1/0068 714/790 |

(Continued)

FOREIGN PATENT DOCUMENTS

| | | |
|---|---|---|
| KR | 10-0689735 | 3/2007 |
| KR | 10-0734346 | 7/2007 |

OTHER PUBLICATIONS

EPO Extended European Search Report dated Jun. 22, 2022, issued in corresponding European Patent Application No. 21216681.3 (8 pages).

*Primary Examiner* — Kwang B Yao
*Assistant Examiner* — Bradley D Lytle, Jr.
(74) *Attorney, Agent, or Firm* — Lewis Roca Rothgerber Christie LLP (57) ABSTRACT

A system includes a first encoder configured to receive first input bits and generate a first stream of first bits based on the first input bits, a bit generator configured to receive second inputs bits and generate a second stream of second bits based on the second input bits, and a PAM4 transmitter configured to receive the first stream of first bits and the second stream of second bits, and generate PAM4 symbols based at least on the first stream of first bits.

14 Claims, 8 Drawing Sheets

(56) References Cited

U.S. PATENT DOCUMENTS

| | | | |
|---|---|---|---|
| 6,870,930 B1* | 3/2005 | Kim | H04L 9/0844 |
| | | | 348/E7.071 |
| 6,897,793 B1* | 5/2005 | Kim | H03M 5/145 |
| | | | 341/59 |
| 6,961,387 B2 | 11/2005 | Kim et al. | |
| 7,127,661 B2 | 10/2006 | Yoon et al. | |
| 7,146,557 B2 | 12/2006 | Kim et al. | |
| 7,293,224 B2* | 11/2007 | Kim | H04J 13/102 |
| | | | 714/790 |
| 7,426,680 B2 | 9/2008 | Hwang et al. | |
| 7,432,834 B1 | 10/2008 | Cideciyan et al. | |
| 7,516,230 B2 | 4/2009 | Sperschneider et al. | |
| 8,007,063 B2 | 12/2011 | Pal et al. | |
| 8,644,431 B2 | 2/2014 | Drumm et al. | |
| 9,166,769 B2 | 10/2015 | Lee | |
| 9,729,681 B2 | 8/2017 | Lee | |
| 10,341,044 B2 | 7/2019 | Zhang et al. | |
| 10,778,366 B2 | 9/2020 | Loncke et al. | |
| 10,944,584 B1* | 3/2021 | Cheng | H04L 12/2801 |
| 11,804,955 B1* | 10/2023 | Blech | H04L 9/3213 |
| 2003/0039318 A1* | 2/2003 | Tong | H04L 27/3411 |
| | | | 375/298 |
| 2005/0135413 A1* | 6/2005 | Yang | H04L 25/4917 |
| | | | 370/463 |
| 2010/0115372 A1* | 5/2010 | Trachewsky | H04L 1/08 |
| | | | 714/790 |
| 2012/0170678 A1* | 7/2012 | Krachkovsky | H03M 13/256 |
| | | | 375/295 |
| 2014/0233673 A1* | 8/2014 | Smith | H04L 27/04 |
| | | | 375/296 |
| 2017/0366380 A1 | 12/2017 | Hwang et al. | |
| 2019/0312676 A1 | 10/2019 | Jeong et al. | |
| 2021/0014091 A1 | 1/2021 | Greiss et al. | |

\* cited by examiner

SYSTEMS AND METHODS FOR TRANSITION ENCODING COMPATIBLE PAM4 ENCODING

FIELD

The present application generally relates to signal processing, and more particularly to systems and methods for transition encoding compatible PAM4 encoding.

BACKGROUND

Transition encoding is used in many signal processing applications where large amounts of data is transmitted over a channel to a receiving end. It is particularly useful in signals that have embedded therein a clock signal within the data signal. One example application of transition encoding is in large panel displays such as televisions. As the sizes of the televisions become large, the signals have to travel over a longer distance. However, one of the consequences of transmitting signals over a long distance is the signal loss. Thus, more efficient techniques for signal processing is desired to minimize loss and transmit more data over a shorter duration is desired.

SUMMARY

According to various embodiments of the present disclosure, a system is described. The system may include a first encoder configured to receive first input bits and generate a first stream of first bits based on the first input bits, a bit generator configured to receive second inputs bits and generate a second stream of second bits based on the second input bits, and a PAM4 transmitter configured to receive the first stream of first bits and the second stream of second bits, and generate PAM4 symbols based at least on the first stream of first bits.

The first stream of first bits may be generated by the first encoder by applying transition encoding to the first input bits.

The first stream of first bits may correspond to most significant bits of the PAM4 symbols generated by the PAM4 transmitter.

The PAM4 symbols may be further based on the second stream of second bits, wherein the second stream of second bits correspond to the least significant bits of PAM4 symbols.

The second stream of second bits may be generated by applying transition encoding to the second input bits.

The second stream of second bits may be generated by the bit generator inserting padding bits to the second input bits.

The first stream of first bits generated by the first encoder may include a transition key and encoded data bits.

The first encoder may be configured to generate the encoded data bits by performing an exclusive OR (XOR) operation on the transition key and the first input bits.

The second stream of second bits generated by the bit generator may include the transition key and the second input bits.

The first stream of first bits generated by the first encoder may include half an amount of bits included in a transition key and encoded data bits, and wherein the second stream of second bits generated by the bit generator includes a remaining half of the bits included in the transition key and the second input bits.

Each PAM4 symbol may correspond to one bit from the first stream of first bits and one bit from the second stream of second bits.

According to other embodiments of the present disclosure, a method is described. The method may include generating, by a first encoder, a first stream of first bits based on first input bits provided to the first encoder, generating, by a bit generator, a second stream of second bits based on second input bits provided to the bit generator, and generating, by a PAM4 transmitter, PAM4 symbols based at least on the first stream of first bits received by the PAM4 transmitter.

The generating the first stream of first bits may include applying transition encoding to the first input bits.

The first stream of first bits may correspond to most significant bits of the PAM4 symbols generated by the PAM4 transmitter.

The generating the PAM4 symbols may be further based on the second stream of second bits, wherein the second stream of second bits correspond to least significant bits of the PAM4 symbols generated by the PAM4 transmitter.

The generating the second stream of second bits may include applying transition encoding to the second input bits.

The generating the second stream of second bits may include generating padding bits and inserting the padding bits to the second input bits.

The first stream of first bits generated by the first encoder may include a transition key and encoded data bits.

The generating the first stream of first bits may further include performing an exclusive OR (XOR) operation on the transition key and the first input bits.

The second stream of second bits generated by the bit generator may include the transition key and the second input bits.

The first stream of first bits generated by the first encoder may include half an amount of bits included in a transition key and encoded data bits, and wherein the second stream of second bits generated by the bit generator includes a remaining half of the bits included in the transition key and the second input bits According to yet other embodiments of the present disclosure, a transition encoding compatible PAM4 encoder is described. The transition encoding compatible PAM4 encoder may include a first transition encoder configured to receive first input bits and generate a transition encoded first stream of first bits based on the first input bits, a bit generator configured to receive second inputs bits and generate a second stream of second bits based on the second input bits, and a PAM4 transmitter configured to receive the first stream of first bits and the second stream of second bits, and generate PAM4 symbols, wherein a most significant bit of the PAM4 symbol is based on the first stream of first bits, and a least significant bit of the PAM4 symbol is based on the second stream of second bits.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

Embodiments of the present disclosure and their advantages are best understood by referring to the detailed description that follows. Unless otherwise noted, like reference numerals denote like elements throughout the attached drawings and the written description, and thus, descriptions thereof will not be repeated. In the drawings, the relative sizes of elements, layers, and regions may be exaggerated for clarity.

DETAILED DESCRIPTION

Hereinafter, example embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described.

Non-return-to-zero (NRZ) is a coding scheme that utilizes a digital signal that changes between two voltage levels, for example −1V and +1V. In this example, −1V may be represented by a symbol such as a binary 0 and +1V may be represented by a binary 1. Accordingly, the NRZ coded data signal may include a series of symbols made up of ones and zeros.

Transition encoding is a coding scheme that takes input data and outputs encoded data that has limited run-lengths (e.g., limited runs of consecutive 0 values and limited runs of consecutive 1 values). In other words, transition encoding encodes the input data such that the output data includes at least one "transition" (e.g., where the data transitions or changes from a 1 to a 0 or from a 0 to a 1), thereby generating a limited run-length data stream. Some transition encoding schemes utilize a key to transform input data. For example, an encoder may add a key (e.g., a transition key) to a string of data signals and the data signal may be encoded based on the key. Thus, when a decoder receives the transition encoded data signal, the decoder may utilize the key to decode the data signal.

Figure 1:
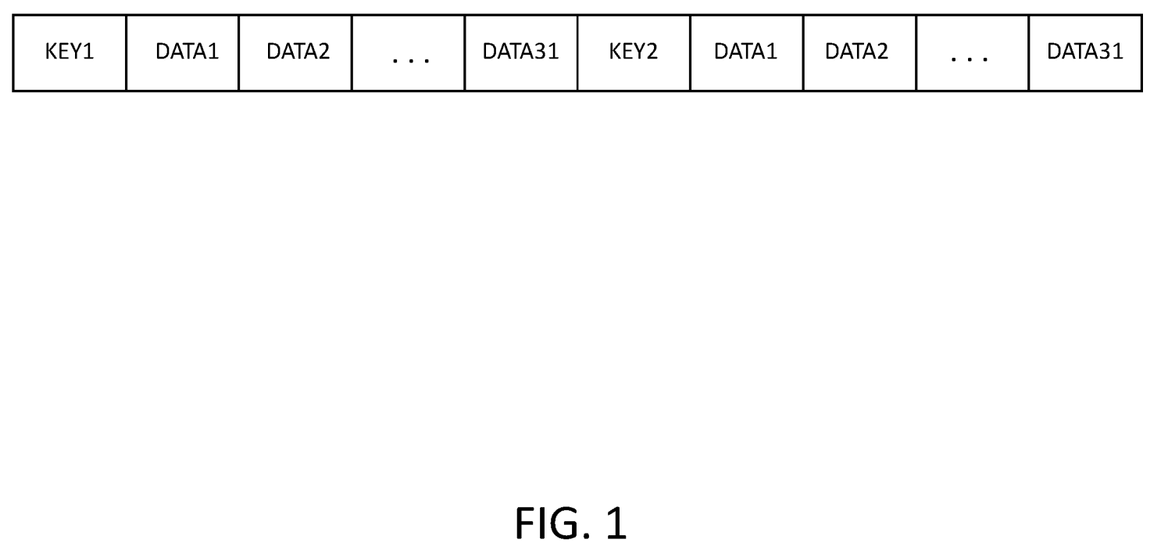
FIG. 1 is an example of an NRZ coded data signal that is transition encoded, according to an embodiment of the present disclosure.

FIG. 1 illustrates an example of a coded data signal that is transition encoded according to various embodiments of the present disclosure. According to an embodiment, a key (e.g., KEY1) may be generated for every certain number of bits of data (e.g., DATA1-DATA31). In the illustrative example shown in FIG. 1, a unique key may be generated for every 31 sets of 6-bits of data. In some embodiments, the key may also comprise 6-bits, and an exclusive OR (XOR) operation may be performed on the key and each set of the 31 sets of data. In other words, the 6-bit key and the 6-bit data (e.g., the first set of the 31 sets of data) may be XOR'd to generate a transition encoded data. Another XOR operation may be performed with the same key and the second set of the 31 sets of data, and so on until each of the 31 sets of data are XOR'd with the same key. Accordingly, 186-bits (i.e., 31 sets x 6-bits) of transition encoded data may be generated based on the key, and the key may be inserted into the stream of data for transmission. In the example of FIG. 1, the key precedes the data bits.

The same process may be repeated for the next 31 sets of data (of 6-bits each), whereby another unique key (e.g., KEY2) may be generated and this key may be XOR'd with each set of the next 31 sets of data to generate another transition encoded data stream. Accordingly, the data stream includes a total of 192-bits, of which 186-bit are transition encoded data bits and 6-bits are key bits, thus resulting with an overhead of about 3%. It should be noted that while the above example is described using a key that comprises 6-bits and the data stream comprises 31 sets of data, in other embodiments, the key may comprise more or less number of bits and the data stream may comprise more or less number of sets. Accordingly, such transition encoding techniques may be used in high speed serial links such as, for example, in a television display. Thus, more efficient techniques for transmitting data is desired to reduce signal loss over lossy channels.

A pulse-amplitude modulation 4-level (PAM4) is a coding scheme that takes a digital signal that changes between four voltage levels, for example, −3V, −1V, +1V, and +3V. Because there are four levels in a PAM4 coding scheme, more data may be transmitted over a channel in a given period of time compared to an NRZ coding scheme. For example, because there are four voltage levels, each voltage level may be represented by 2-bits (e.g., 00, 01, 11, 10) instead of 1-bit as in the case of NRZ coding scheme that only uses two voltage levels.

Figure 2:
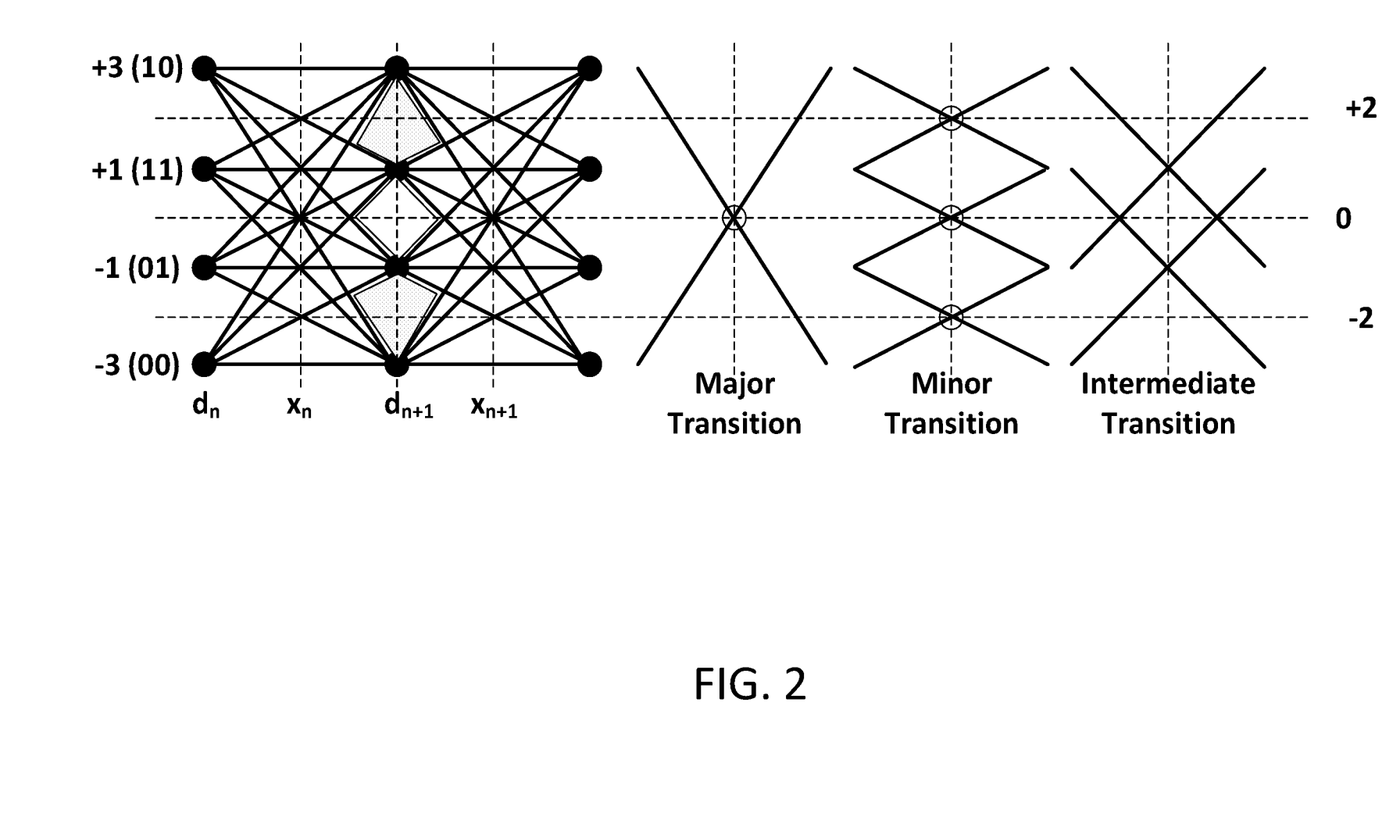
FIG. 2 is a diagram illustrating possible transitions in a PAM4 coded signal, according to an embodiment of the present disclosure.

FIG. 2 illustrates possible transitions in a PAM4 coded signal that can transition between the four distinct voltage levels. Thus, by applying a transition encoding scheme to the PAM4 coded signal in a similar manner to the transition encoding for an NRZ coded signal as previously described with reference to FIG. 1, a more efficient encoding scheme may be achieved.

By considering the possible transitions in a PAM4 coded signal, the transitions may be described in terms of a major transition, where the voltage transitions from the highest voltage level to the lowest voltage level (e.g., from +3V to −3V, or −3V to +3V); a minor transition, where the voltage transitions to the next higher or the next lower voltage level (e.g., from +3V to +1V, +1V to +3V, +1V to −1V, −1V to +1V, −1V to −3V, −3V to −1V); or an intermediate transition, where the voltage transition is greater than a major transition but less than a minor transition (e.g., from +3V to −1V, −1V to +3V, +1V to −3V, −3V to +1V). Based on the 12 different possible transitions in a PAM4 coding scheme, only four of the minor transitions do not pass through the zero threshold during the transition. Therefore, an encoding scheme that provides periodic major transitions or intermediate transitions may result in a signal that is detectable with a slicer that monitor the zero threshold (e.g., a crossing slicer). Accordingly, costs associated with adding a slicer configured to monitor for minor transitions to a receiver may be avoided, resulting in a relatively less expensive receiver.

Embodiments of the present disclosure are directed to encoding techniques that provides transitions that cross the zero threshold (e.g., a major transition or an intermediate transition) so that a clock recovery process that targets such transitions in a data signal may extract a clock signal from the data signal. It is noted that while the example PAM4 transition voltages illustrated in FIG. 2 are shown as −3V, −1V, +1V, and +3V, actual transition voltages may be replaced with any other four distinct transition voltage levels such as, for example, −5V, −2V, +2V, and +5V; or +1V, +2V, +3V, and +4V.

Figure 3:
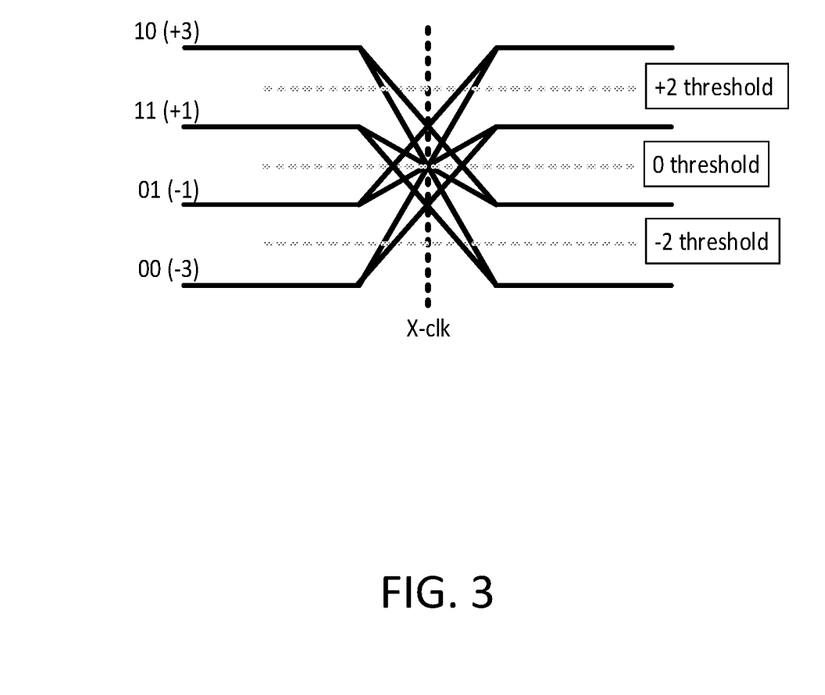
FIG. 3 is a diagram illustrating eight possible transitions of a PAM4 coding scheme that crosses the zero threshold, according to an embodiment of the present disclosure.

FIG. 3 shows the eight possible transitions of a PAM4 coding scheme that crosses the zero threshold. According to an embodiment, each voltage level (e.g., −3V, −1V, +1V, and +3V) may be assigned a 2-bit binary symbol, for example, the +3V level may be assigned the symbol 10, the +1V level may be assigned the symbol 11, the −1V level may be assigned the symbol 01, and the −3V level may be assigned the symbol 00. Accordingly, when the data signal transitions from one level to another level and crosses the zero threshold, the most significant bit (MSB) of the 2-bit code always changes. In other words, when the voltage level transitions, for example, from +3V to −1V, the 2-bit code changes from 10 to 01, wherein the MSB changes from 1 to 0. Similarly, when the voltage level transitions from −3V to +3V, the 2-bit code changes from 00 to 10, wherein the MSB changes from 0 to 1. Accordingly, every transition illustrated in FIG. 3 crosses the zero threshold and experiences a change in the MSB of the 2-bit symbol.

Figure 4:
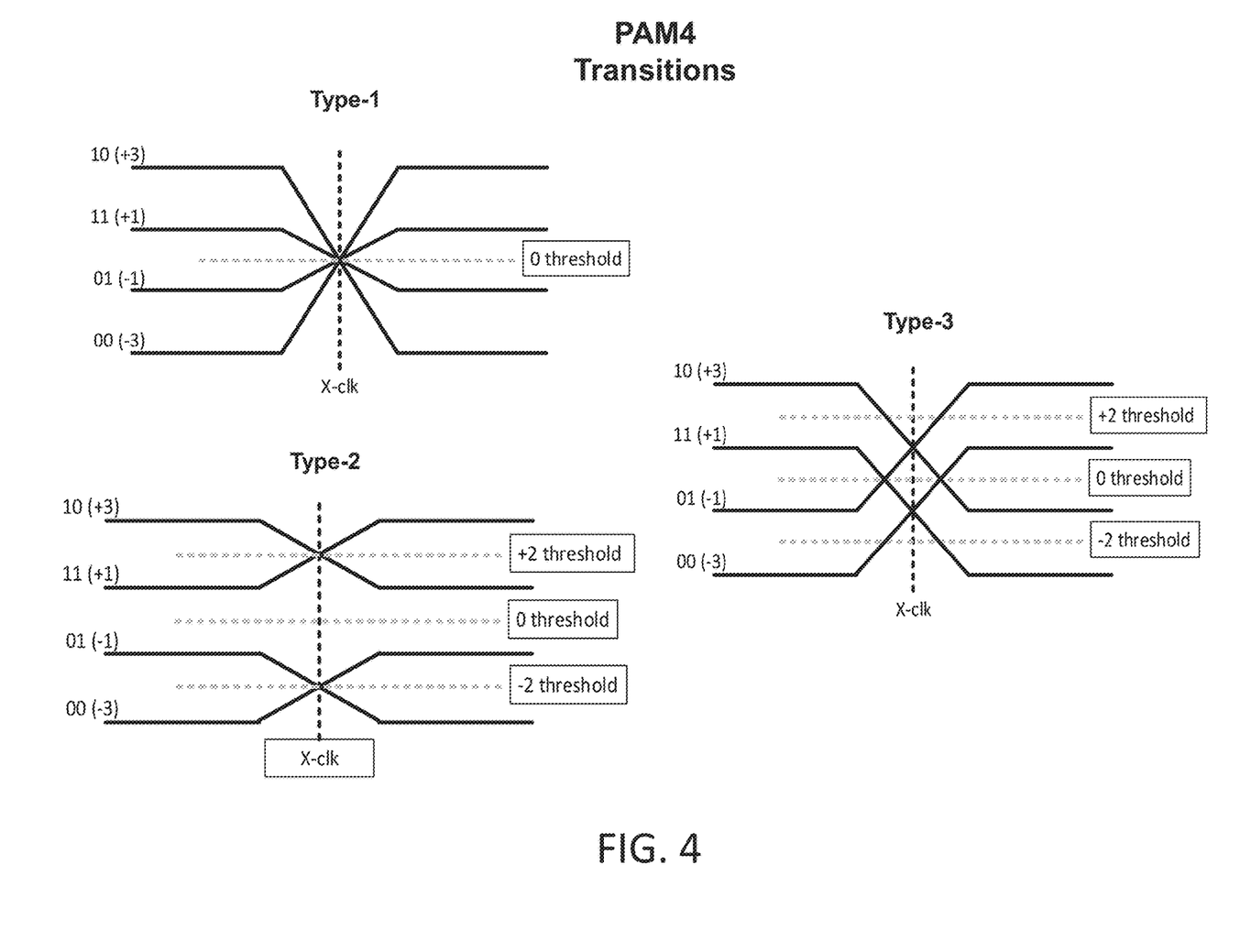
FIG. 4 is a diagram illustrating the possible transitions shown in FIG. 3, separated into different categories, according to an embodiment of the present disclosure.

FIG. 4 illustrates the possible transitions shown in FIG. 3, separated into different categories. For purposes of this disclosure, a type 1 transition is a transition where the voltage level transitions from one positive voltage level to its corresponding negative voltage level, or from one negative voltage level to its corresponding positive voltage level. For example, the voltage level may transition from +3V to −3V, −3V to +3V, +1V to −1V, or −1V to +1V. A type 2 transition is a transition where the polarity of the voltage level does not change, and therefore the transition does not cross the zero threshold. For example, the voltage level may transition from +3V to +1V, +1V to +3V, −3V to −1V, or −1V to −3V. A type 3 transition is a transition where the voltage level transitions from one positive voltage level to another negative voltage level, or from one negative voltage level to another positive voltage level. For example, the voltage level may transition from +3V to −1V, −1V to +3V, −3V to +1V, or +1V to −3V.

Accordingly, every transition of the type 1 and type 3 categories experiences a change in the MSB of the 2-bit code, whereas the transitions of the type 2 category maintain the same MSB of the 2-bit code. Accordingly, if transition encoding is applied to the MSB of the 2-bit code to provide transitions in the MSB, transitions that cross the zero threshold will occur. A transmitter that provides such transitions may be used in conjunction with a receiver that includes one or more slicers to monitor the 0V threshold and may not include slicers that monitor other thresholds. Thus, the disclosed transmitter may be compatible with relatively less complex receivers. In some embodiments, the LSB of the 2-bit code may be ignored. Yet, in other embodiments, the transition encoding of the MSB may be applied to the LSB of the 2-bit code for error detection, which will be described in more detail later with reference to FIG. 6.

Figure 5:
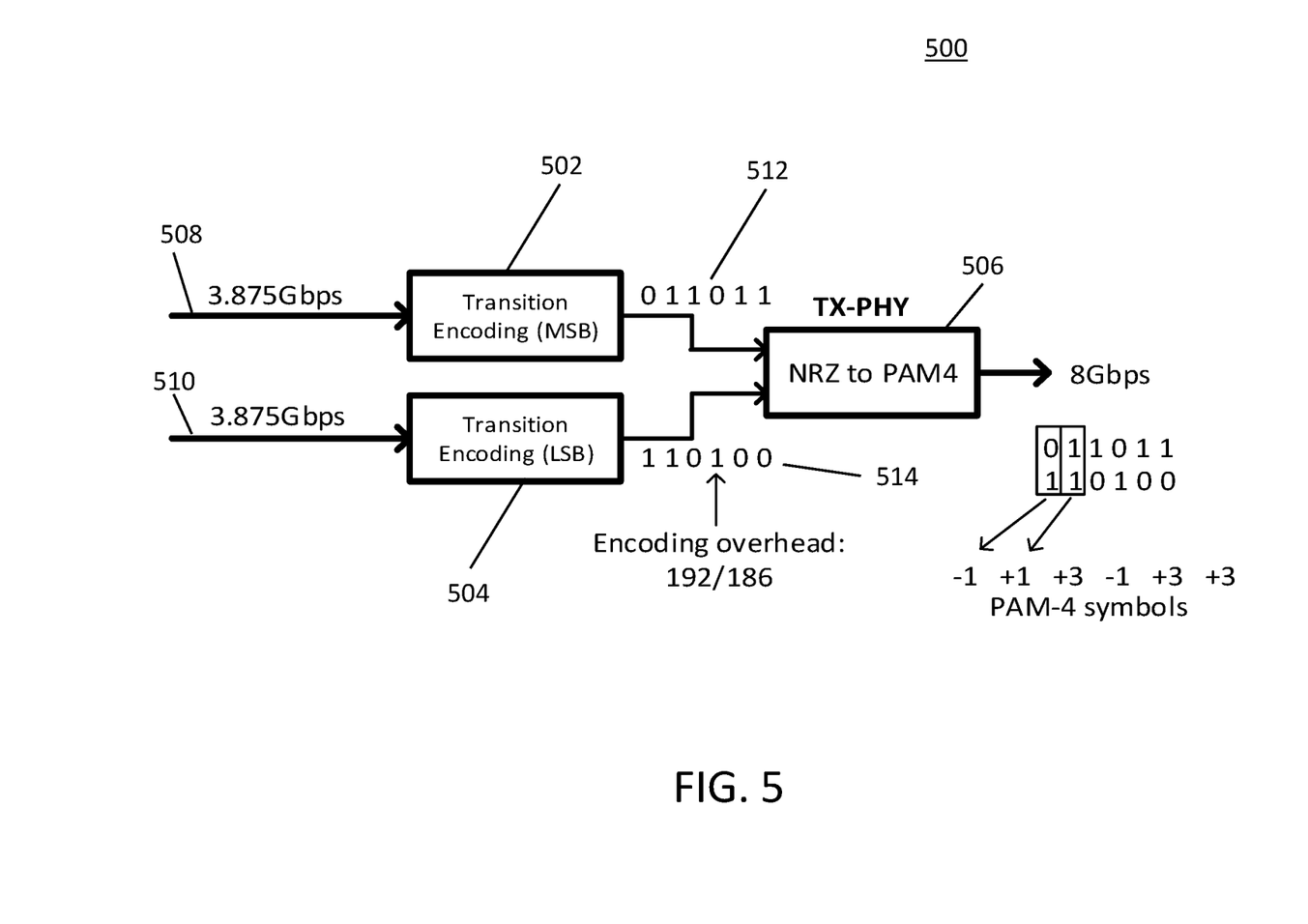
FIG. 5 is a block diagram of an example encoder for implementing the PAM4 transition encoding scheme, according to an embodiment of the present disclosure.

FIG. 5 is a block diagram of an example encoder 500 for implementing the PAM4 transition encoding scheme according to various embodiments of the present disclosure. The encoder 500 includes two transition encoders in parallel, wherein each transition encoder is configured to apply transition encoding to an input data signal, and output an NRZ data stream. In some embodiments, the output NRZ data stream also includes a key as described earlier. The NRZ data stream may be then be converted to a PAM4 data stream by a PAM4 transmitter 506 for transmission to a receiver.

According to an embodiment, a first data signal 508 is provided to a first transition encoder 502. The first transition encoder 502 applies transition encoding to the first data signal 508 and generates a first stream of first bits 512. Run lengths of repeated values are limited in the first stream of first bits 512 by the transition encoding, which in turn, assures that a transition occurs and therefore crosses the 0V threshold. In some embodiments, the first stream of first bits 512 may include just a stream of NRZ coded data bits, while in other embodiments, the first stream of first bits 512 may include data bits and TCD key bits.

In the illustrated embodiment, the first stream of first bits 512 include 6 bits of overhead (e.g., key bits) for every 186 bits of data, however other encoding efficiencies are possible. In some illustrative examples, the first transition encoder 502 packetizes the first data signal 508 into packets that each include 31 sets of 6-bit data. The first transition encoder 502 may then identify a 6-bit key for a transformation that when applied to the 31 sets results in 31 6-bit transformed sets that have at least one transition (e.g., the 31 transformed sets do not include 000000 or 111111). The 31 6-bit transformed sets and the 6-bit key may be output by the first transition encoder 502 as part of the first stream of first bits 512. Therefore, a packet in the first stream of first bits may include 192-bits total of which 186-bits is data and 6-bits is overhead. While the first transition encoder 502 is described as generating 192 bit packets with 186 data bits and 6 key bits, it should be noted that the encoder may generate packets of different sizes, packets that include sets (e.g., words) of different sizes, keys of different sizes, or a combination thereof. Further, it should be noted that while a packet-based transition encoding scheme is described above, the first transition encoder 502 may operate according to a stream-based transition encoding scheme or other type of transition encoding scheme.

In some embodiments, the encoder 500 further includes a second transition encoder 504. A second data signal 510 is provided to the second transition encoder 504, and the second transition encoder 504 applies the transition encoding to the second data signal 510 and generates a second stream of second bits 514. In some embodiments, the second stream of second bits 514 may also be NRZ coded bits. The second transition encoder 504 may implement any type of transition encoding scheme, as described above with reference to the first transition encoder 502. In the illustrated example, the second stream of second bits 514 includes 6 overhead bits (e.g., key bits) for every 186 bits of data in the second data signal 510, but other efficiencies are possible. In some embodiments, the first data signal 508 and the second data signal 510 may be the same data signal. In other embodiments, the first data signal 508 and the second data signal 510 may be different signals.

In some embodiments, the first transition encoder 502 takes the first data signal 508, which may be, for example, a 3.875 Gbps signal, and generates a first stream of first bits 512 that includes encoded data bits. In some embodiments, the first stream of first bits 512 may also include the key. The second transition encoder 504 takes the second data signal 510, which may also be, for example, a 3.875 Gbps signal, and generates a second stream of second bits 514 that includes encoded data bits. In some embodiments, the second stream of second bits 514 may also include another key. For purposes of explaining the example embodiments, the key for the first stream of first bits 512 may be assumed to be 011011 and the key for the second stream of second bits 514 may be assumed to be 110100, by way of example only. Accordingly, such encoding schemes that use keys may limit the run lengths of both the data bits and the selected keys.

According to an embodiment of the present disclosure, the first stream of first bits 512 and the second stream of second bits 514 with limited run lengths are provided in parallel to a PAM4 transmitter 506. The PAM4 transmitter 506 converts the first stream of first bits 512 and the second stream of second bits 514 from an NRZ coding scheme to a PAM4 coding scheme comprising four voltage levels. Moreover, the first stream of first bits 512 is converted to become the MSB of the PAM4 symbol and the second stream of second bits 514 is converted to become the least significant bit (LSB) of the PAM4 symbol. For example, if the key for the first stream of first bits 512 is 011011 and the key for the second stream of second bits is 110100, then the PAM4 transmitter 506 generates PAM4 symbols 01, 11, 10, 01, 11, and 11, which correspond to voltage levels −1V, +1V, +3V, −1V, +3V, and +3V based on the example four voltage levels. Because the transition encoding of the first data signal 508 by the first transition encoder 502 limits run-lengths in the MSBs of symbols transmitted by the PAM4 transmitter 506, voltage transitions that cross 0V are provided in output of the PAM4 transmitter 506. These voltage transitions may not depend on whether LSBs of output of the PAM4 transmitter change. Therefore, some embodiments may reduce costs and/or complexity of a transmitter by removing the second transition encoder 504 and replacing it with a simpler block such as a bit generator. It should be noted that the same process described in the above example, of converting the key bits from NRZ to PAM4, may be applied to convert the data bits from NRZ to PAM4.

In some embodiments, the converted PAM4 symbols are transmitted to a receiver, for example, in a television display. Accordingly, by encoding two 3.875 Gbps digital signals in parallel, a single 8 Gbps PAM4 signal may be generated.

Figure 6:
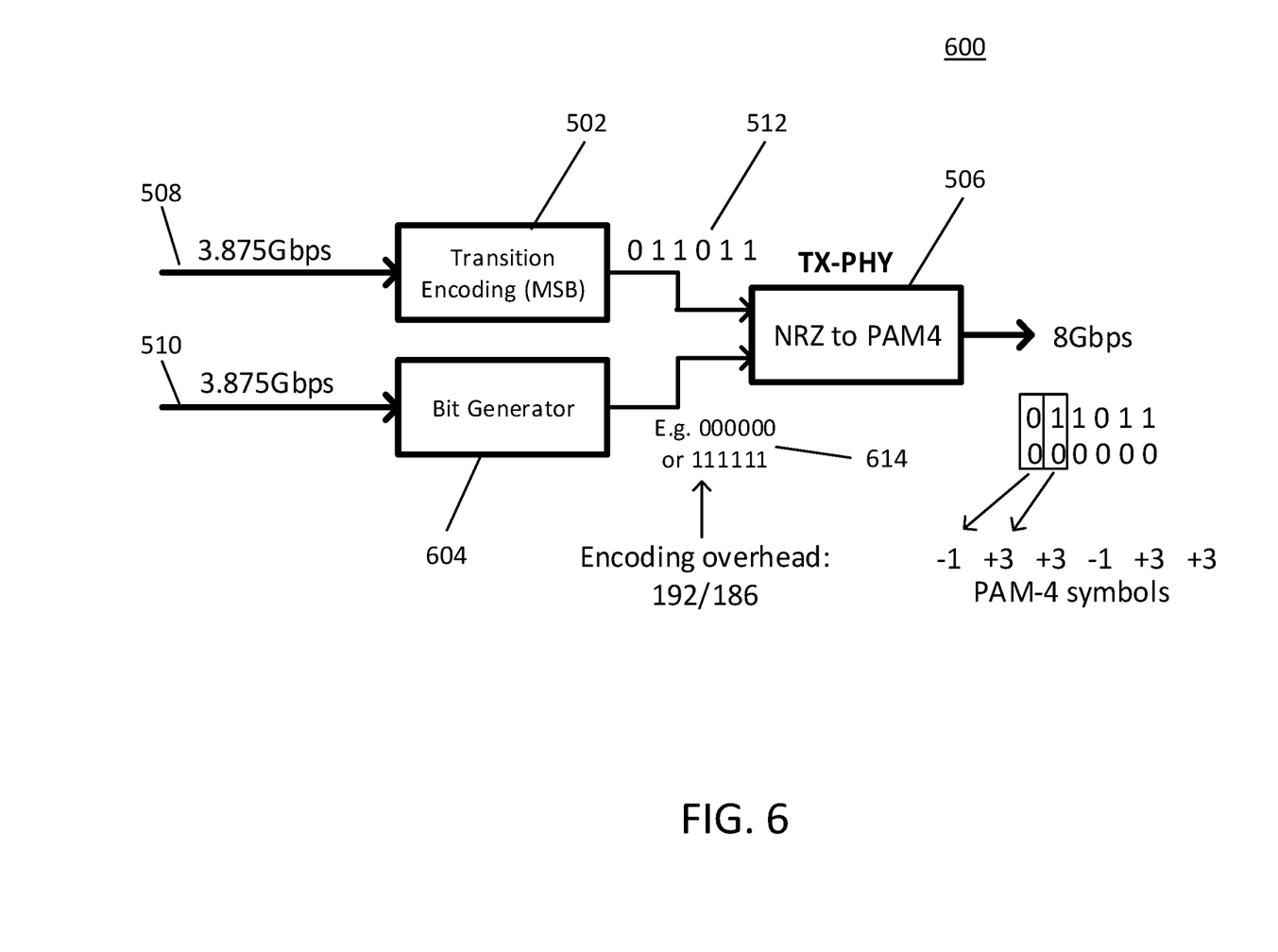
FIG. 6 is a block diagram of an example encoder for implementing the PAM4 transition encoding scheme, according to another embodiment of the present disclosure.

FIG. 6 is a block diagram of an example encoder 600 that does not include a second transition encoder, according to an embodiment of the present disclosure. The elements of the encoder 600 in FIG. 6 that are the same as the elements in encoder 500 of FIG. 5 will not be described again. Instead, only the differences will be described.

According to some embodiments, the second transition encoder 504 of FIG. 5 may be replaced by, for example, a bit generator 604 that pads the second data signal 510 with a number of bits equivalent to the number of overhead bits added by the first transition encoder 502. The actual value of the bits used for padding the second data signal 510 is not important and therefore may be all zeros (000000), all ones (111111), or other random values as long as the number of padding bits is the same as the number of overhead bits added by the first transition encoder 502. This is because the second stream of second bits 614 correspond to the LSB of the of the PAM4 symbols, and therefore may be ignored. It should be noted that the bit generator 604 merely inserts the padding bits to the second data signal 510 and does not change the bits of the second data signal 510 as with the first transition encoder 502 used for the first data signal 508. Therefore, by inserting all zeros, all ones, or random values, an encoder may be eliminated from being used with the second data signal 510 and may be replaced with a simpler, less complex bit generator 604, thereby reducing the cost of the transmitter, while maintaining alignment between the outputs of first transition encoder 502 and bit generator 604. As described above, the PAM4 transmitter 506 is configured to convert the first stream of first bits 512 into the MSB of output PAM4 symbols and transmit the PAM4 symbols to a receiver. Because run-lengths are limited in the MSBs by the first transition encoder 502, transitions that cross 0V may occur in output of the PAM4 transmitter 506.

In some embodiments, the key generated by the first transition encoder 502 may be duplicated and inserted in to the second data signal 510 to generate a second stream of second bits 614 that merely includes the same key as the key for the first stream of first bits 512. In other words, the data bits of the second data signal 510 is not changed or transitions encoded, but rather the key is merely inserted to pad the second stream of second bits 614. Accordingly, the alignment of the first stream of first bits 512 and the second stream of second bits 614 may be maintained. By duplicating the key generated by the first transition encoder 502 and inserting it into the second data signal 510, error detection of the key may be performed. For example, in some embodiments, when the PAM4 transmitter 506 receives the first stream of first bits 512 and the second stream of second bits 614 and detects that the overhead bits for each stream are not the same, then an error may be present in the data stream and the PAM4 transmitter 506 may not transmit the signal to the receiver. In other embodiments, the receiver may be configured to detect the error and therefore reject the incoming data when it detects that the data stream includes errors.

Figure 8:
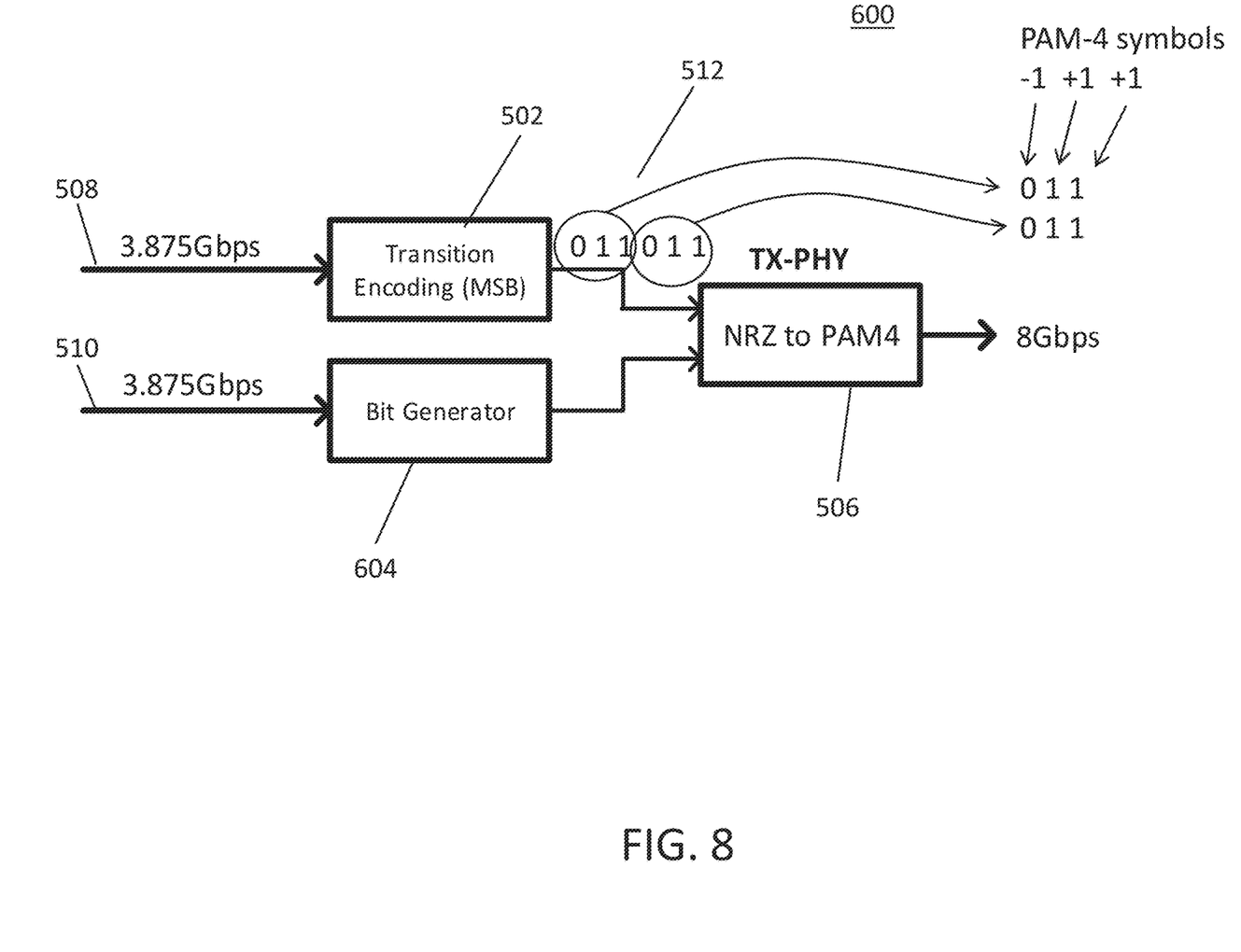
FIG. 8 is a block diagram of an example encoder for implementing the PAM4 transition encoding scheme, according to another embodiment of the present disclosure.

Yet in other embodiments, the first transition encoder 502 may generate a 6-bit key and perform transition encoding on the first data signal 508, but instead of inserting all 6-bits into the first stream of first bits 512, it may insert only a portion of the 6-bits (e.g., 3-bits) into the first stream of first bits 512 as shown, for example, in FIG. 8. The 3 additional bits (out of the total of 6-bits generated) may be inserted as padding bits to the second stream of second bits 614, thereby reducing the overall length of the bits from 192 bits to 189 bits in each of the first stream of first bits 512 and the second stream of second bits 614. In this case, only 3 bits out of 189 bits are the overhead, thereby reducing the percentage of overhead bits in each stream.

In some embodiments, the receiver may be configured to take the 3 overhead bits from the LSB of the PAM4 symbols and reassemble the key for the MSB of the PAM4 symbols. Accordingly, the efficiency may be improved. It is noted that the embodiments of the present disclosure are described by referencing specific examples, such as a data signal having 31 sets of 6-bit data, a key that is 6 bits, etc. However, such specific examples are provided merely as means to explain the various embodiments of the present disclosure and are not intended to be limited. Instead, other variations may be envisaged by those having ordinary skill in the art. For example, the data may be in packets or the data may be streams of data, each of the data sets may be 8-bits, 4-bits, or n-bits in length, and/or the key may be 8 bits or m-bits in length. Therefore, the percentage of the overhead bits may also vary.

Figure 7:
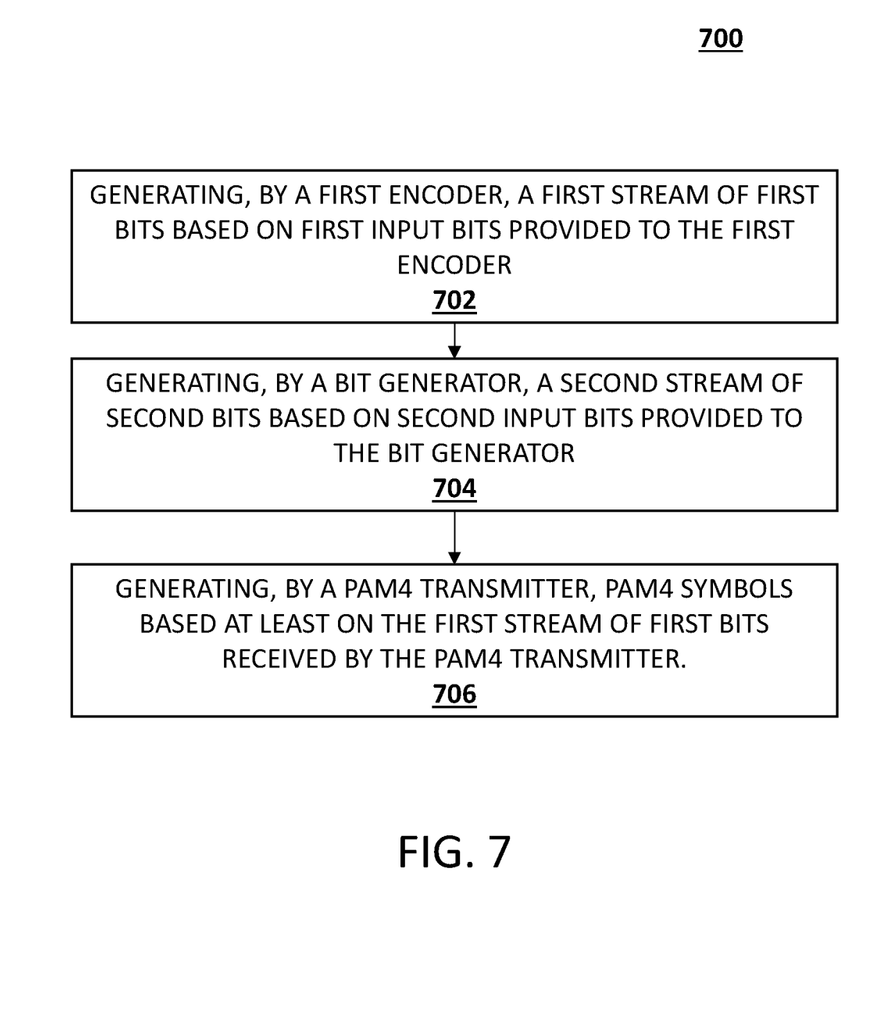
FIG. 7 is a flow chart of the method for transition encoding compatible PAM4 encoding, according to an embodiment of the present disclosure.

FIG. 7 is a flow chart of the method for performing transition encoding compatible PAM4 encoding, according to various embodiments of the present disclosure. In some embodiments, first input bits may be received by a first encoder. For example, the first input bits may be high speed (e.g., 3.875 Gbps) packets of data bits or it may be a stream of data bits. The first encoder may be a transition encoder that is configured to encode the received first input bits to generate a first stream of first bits based on the first input bits (702). In some embodiments, the first stream of first bits may be generated by the first encoder by applying transition encoding to the first input bits. In some embodiments, second inputs bits may be received by a bit generator. In some embodiments, the bit generator may be an encoder such as a transition encoder. Yet, in other embodiments, the bit generator may simply be a device that generates additional bits. Accordingly, the bit generator may generate a second stream of second bits based on the second input bits (704). For example, the bit generator may generate padding bits (e.g., bits where the value of the bits are not important) that are inserted or added to the second input bits. In some embodiments, the number of padding bits generated by the bit generator may be equivalent to the number of key bits generated by the first encoder (as described earlier with reference to FIG. 5). In some embodiments, a PAM4 transmitter may be configured to generate PAM4 symbols based at least on the first stream of first bits received by the PAM4 transmitter from the first encoder (706). For example, in some embodiments, the first stream of first bits may correspond to the MSB of the generated PAM4 symbols. In some embodiments, the PAM4 symbols may be generated based further on the second stream of second bits. In this case, the second stream of second bits may correspond to the LSB of the generated PAM4 symbols. Accordingly, input NRZ data bits may be transition encoded and then transformed into PAM4 symbols to improve efficiencies in high speed serial links.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively.

The electronic or electric devices and/or any other relevant devices or components according to embodiments of the present invention described herein may be implemented utilizing any suitable hardware, firmware (e.g. an application-specific integrated circuit), software, or a combination of software, firmware, and/or hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Embodiments described herein are examples only. One skilled in the art may recognize various alternative embodiments from those specifically disclosed. Those alternative embodiments are also intended to be within the scope of this disclosure. As such, the embodiments are limited only by the following claims and their equivalents.

What is claimed is:

1. A system comprising:
   a first encoder configured to receive first input bits and generate a first stream of first bits by applying transition encoding to the first input bits based on a transition key;
   a bit generator configured to receive second inputs bits and generate a second stream of second bits based on the second input bits; and
   a Pulse-Amplitude Modulation 4-Level (PAM4) transmitter configured to receive the first stream of first bits and the second stream of second bits, and generate PAM4 symbols based at least on the first stream of first bits,
   wherein the first stream of first bits comprises half an amount of bits comprising the transition key and encoded data bits, and the second stream of second bits comprises a remaining half of the bits comprising the transition key and the second input bits.

2. The system of claim 1, wherein the first stream of first bits correspond to most significant bits of the PAM4 symbols generated by the PAM4 transmitter.

3. The system of claim 2, wherein the PAM4 symbols are further based on the second stream of second bits, wherein the second stream of second bits correspond to the least significant bits of PAM4 symbols.

4. The system of claim 3, wherein the second stream of second bits is generated by applying transition encoding to the second input bits.

5. The system of claim 3, wherein the second stream of second bits is generated by the bit generator inserting padding bits to the second input bits.

6. The system of claim 1, wherein the first encoder is configured to generate the encoded data bits by performing an exclusive OR (XOR) operation on the transition key and the first input bits.

7. The system of claim 2, wherein each PAM4 symbol corresponds to one bit from the first stream of first bits and one bit from the second stream of second bits.

8. A method comprising:
   generating, by a first encoder, a first stream of first bits by applying transition encoding to first input bits provided to the first encoder based on a transition key;
   generating, by a bit generator, a second stream of second bits based on second input bits provided to the bit generator; and
   generating, by a Pulse-Amplitude Modulation 4-Level (PAM4) transmitter, PAM4 symbols based at least on the first stream of first bits received by the PAM4 transmitter,
   wherein the first stream of first bits comprises half an amount of bits comprising the transition key and encoded data bits, and the second stream of second bits comprises a remaining half of the bits comprising the transition key and the second input bits.

9. The method of claim 8, wherein the first stream of first bits correspond to most significant bits of the PAM4 symbols generated by the PAM4 transmitter.

10. The method of claim 9, wherein the generating the PAM4 symbols is further based on the second stream of second bits, wherein the second stream of second bits correspond to least significant bits of the PAM4 symbols generated by the PAM4 transmitter.

11. The method of claim 10, wherein the generating the second stream of second bits comprises applying transition encoding to the second input bits.

12. The method of claim 10, wherein the generating the second stream of second bits comprises generating padding bits and inserting the padding bits to the second input bits.

13. The method of claim 8, wherein the generating the first stream of first bits further comprises performing an exclusive OR (XOR) operation on the transition key and the first input bits.

14. A transition encoding compatible PAM4 encoder, comprising:
   a first transition encoder configured to receive first input bits and generate a transition encoded first stream of first bits by applying transition encoding to the first input bits based on a transition key;
   a bit generator configured to receive second inputs bits and generate a second stream of second bits based on the second input bits; and
   a Pulse-Amplitude Modulation 4-Level (PAM4) transmitter configured to receive the first stream of first bits and the second stream of second bits, and generate PAM4 symbols, wherein a most significant bit of the PAM4 symbol is based on the first stream of first bits, and a least significant bit of the PAM4 symbol is based on the second stream of second bits,
   wherein the first stream of first bits comprises half an amount of bits comprising the transition key and encoded data bits, and the second stream of second bits comprises a remaining half of the bits comprising the transition key and the second input bits.

* * * * *